United States Patent
Tracewell et al.

[11] Patent Number: 5,945,746
[45] Date of Patent: Aug. 31, 1999

[54] POWER SUPPLY AND POWER SUPPLY/ BACKPLANE ASSEMBLY AND SYSTEM

[75] Inventors: Larry L. Tracewell, Dublin; Matthew S. Tracewell; John Kociecki, both of Powell, all of Ohio

[73] Assignee: Tracewell Power, Inc., Columbus, Ohio

[21] Appl. No.: 08/915,861

[22] Filed: Aug. 21, 1997

[51] Int. Cl.⁶ ..................................... H05K 7/20
[52] U.S. Cl. ............................ 307/43; 363/141; 361/646; 361/697; 323/907; 257/712; 165/104.33; 165/185
[58] Field of Search ................................ 307/43; 303/141; 361/717–719, 704, 707, 695, 697, 796, 696; 323/907; 257/712; 165/185, 104.33

[56] References Cited

U.S. PATENT DOCUMENTS

| | | | |
|---|---|---|---|
| 4,694,123 | 9/1987 | Massey | 361/795 |
| 4,935,864 | 6/1990 | Schmidt et al. | 323/907 |
| 4,941,067 | 7/1990 | Craft | 165/185 |
| 5,101,320 | 3/1992 | Bhargava et al. | 361/796 |
| 5,305,186 | 4/1994 | Appelt et al. | 361/704 |
| 5,404,270 | 4/1995 | Carlstedt | 165/104.33 |
| 5,424,914 | 6/1995 | Smith et al. | 361/796 |
| 5,817,987 | 10/1998 | Williams et al. | 174/52.1 |

*Primary Examiner*—Albert W. Paladini
*Attorney, Agent, or Firm*—Mueller and Smith LPA

[57] ABSTRACT

A power supply/backplane assembly and system wherein a substantially flat power supply assembly including a printed circuit, power converter modules, and heat sink is mounted directly to the rearwardly disposed surface of a backplane. The size of the power supply and the region at which it is mounted substantially falls within the border of a fully defined region of the backplane. Flat copper traces carried by the power supply circuit board function to carry regulated power directly to the backplane via a power bolt system. Thus, conventional cabling is eliminated. The circuit board also is employed in conjunction with readily accessible connector components to provide for simplified wiring installation of support features such as the interaction between a supervisory panel and a front end a.c.-to-d.c. conversion component.

25 Claims, 11 Drawing Sheets

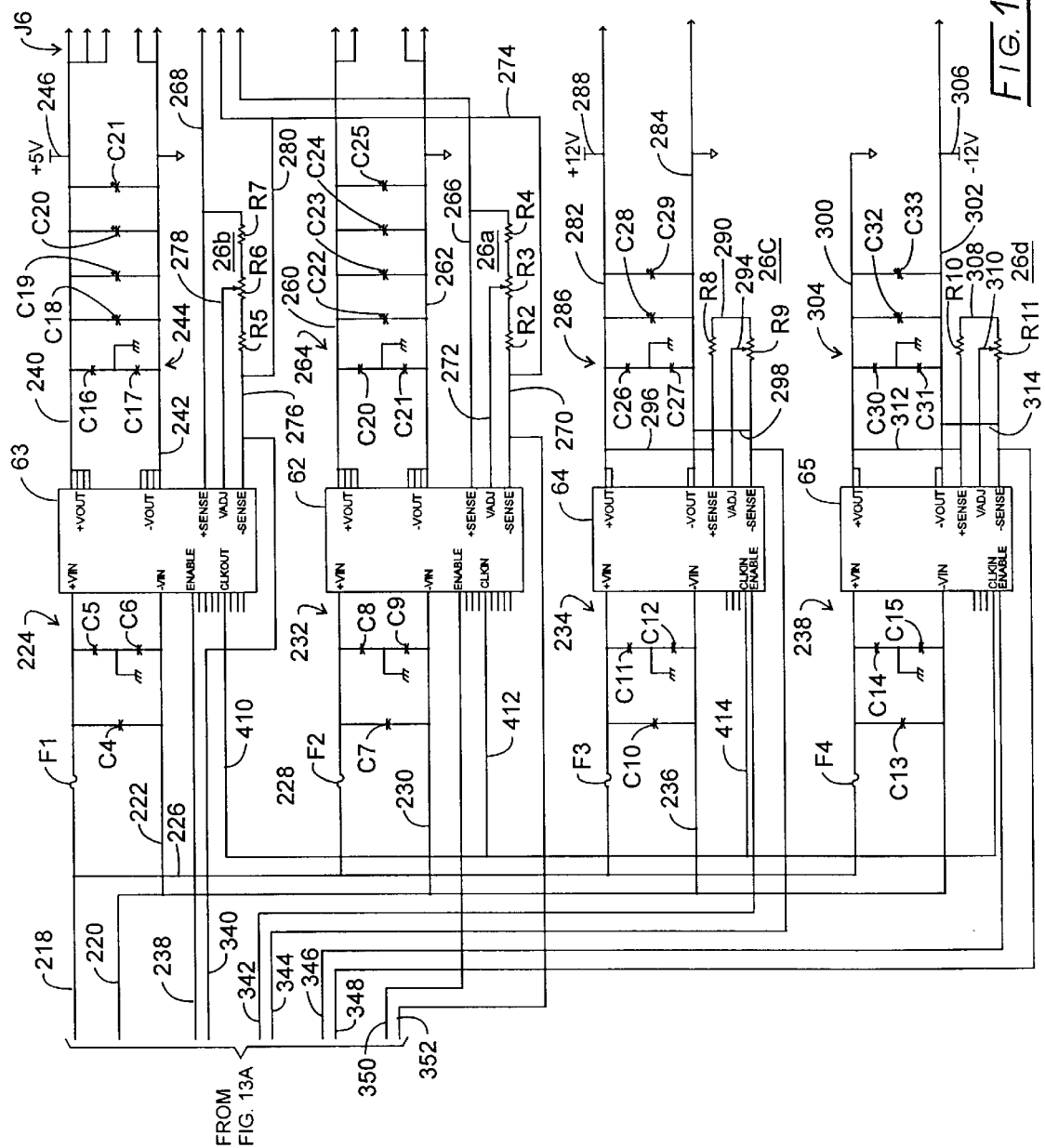

POWER SUPPLY AND POWER SUPPLY/BACKPLANE ASSEMBLY AND SYSTEM

CROSS-REFERENCE TO RELATED APPLICATIONS

Not applicable.

STATEMENT REGARDING FEDERALLY SPONSORED RESEARCH

Not applicable.

BACKGROUND OF THE INVENTION

Early microcomputers employed buses which were direct extensions of the signal lines appearing at the pins of a microprocessor. As the technology associated with the latter components rapidly progressed, users and manufacturers recognized the value of some bus standardization to facilitate system upgrading or new electronic system designs. The advantage of compatibility at the local bus level was realized early and the electronics industry evolved a number of bus standards based upon the back-plane/bus specifications of more popular microprocessors and microcomputers.

Over a period of time, a number of official IEEE Bus Standards have been developed and are generally in varying stages of formal adoption. In addition, manufacturers and military and scientific users continue to define their own bus standards. Predominant among these standards is the "VME BUS", the term "VME" representing a back-plane/bus structure referred to as "versa module Europe", developed by Motorola/Mostek/Signetics-Phillips. A "VXI Consortium" of industry and government, the term representing an acronym for "VME BUS extension for instrumentation" evolved "VXI" specifications for a VXI/VME back-plane/bus.

In general, the back-plane/bus specifications look to the aspects of system environmental requirements such as air flow, power source derived voltage outputs, connector pin assignment, protocols and the like. Specified power supplies are required with the standards which are manifested as a sequence of voltage outputs which must remain within defined tolerances.

To complement the evolving sophistication of the backplane/bus devices and systems, improvements in supporting power supplies also have occurred. In this regard, power-switching converters are becoming an essential part of many electronic systems as industry continues its quest for miniaturization. In general, the switching converter is a power electronic system that converts one level of electrical energy to another level, at the load, by switching action. These devices continue to exhibit higher switching frequencies, newer topologies, and new integrated-circuit controllers with attendant increased conversion efficiency and power-packaging density. In the latter regard, manufacturers of these power supplies offer them as "bricks", the small devices generally being rectangularly shaped packages of typically flat configuration, one side of which incorporates a heat transfer surface generally formed of aluminum. Because of their small size and interconnectability, the bricks are sometimes referred to as "modular power converters". These modular power converters typically are of a d.c.-to-d.c. variety, converting a higher level d.c. input voltage of about 180 to 400 volts to backplane/bus specified voltage values, for example for VME systems, of 5vdc, +12vdc, −12vdc, and −3.3vdc, or different combinations of such input levels. In utilizing these converter modules, power supply manufacturers combine them within a sub-housing which will include an air circulation fan or fans and supporting circuitry. The bolt-on outputs of the collection of converter modules within the sub-housing will be exposed at one of their ends for connection by cabling to corresponding power supply inputs at the backplane and elsewhere. This sub-housing containing the converter modules generally will be incorporated within a main housing holding the backplane and those functional circuit boards or "cards" connected to it along with chassis temperature controlling fans and the like. The use of such cabling has been problematic. These cables are typically of large gauge wire, for example from 12 gauge to as low as 0 gauge, having ring tongue lugs on them which are bolted to connectors using specified torques. Such cables may vibrate with time and loosen-up such that their current handling capability often is dependent upon how reliable the torqued connection remains. The inherent induction exhibited by cables imposes electrical delay which, without correction, is manifested in current delivery difficulties where the load requires a sudden pulse of relatively large current quantity, for example as memory banks are accessed. It is desirable to be able to draw such current from a low impedance or a capacitive source. Unfortunately, cables appear as a high impedance inductive source such that there would exist an undershoot of current supplied at the commencement of such current demand and a corresponding tendency for the current to be maintained or exhibit overshoot phenomenon at the termination of a demand pulse. This undershoot and overshoot characteristic occurs generally in immunity from the lengths of cable involved. While correcting circuitry is provided to accommodate this load-related phenomenon, its addition to a system, in itself, detracts from system reliability.

Over the recent past, chassis designs themselves have been the subject of significant improvement. Their general structuring of basically a "card cage", backplane, fans, and rearwardly mounted power supply sub-assembly originally was made available to users in that basic or simplistic format or structuring. Tracewell, in U.S. Pat. No. 5,168,171, issued in 1992, describes a mainframe enclosure which incorporated a microprocessor-driven support system functioning to monitor the status of power supplies, which provided an improved cooling air flow path and further provided temperature monitoring. Importantly, the status information and system controls were established at a user accessible supervisory panel mounted at the front face of the enclosure. Sold under the trade designation "Intelligent Mainframe", the improved enclosure design found ready acceptance in the electronics industry.

As electronic systems supported by mainframe enclosures continue to evolve in both sophistication and miniaturization, there is arising a concomitant call for more compact system size and, thus, more compact enclosures and system support components. These more compact systems preferably will include more efficient power delivery features exhibiting higher levels of operational reliability as well as compactness.

BRIEF SUMMARY OF THE INVENTION

The present invention is addressed to a power supply/backplane assembly and system wherein the power supply assembly is diminutive in size and exhibits a thin, flat architecture. That architecture permits it to be mounted directly to a backplane. Incorporating a circuit board upon which are mounted modular d.c.-to-d.c. power converters and supporting circuitry, a combination is achieved wherein trouble from cabling topologies is eliminated, regulated power being supplied directly from the circuit board into power bolts. Those power bolts are coupled, in turn, directly to power distribution planes or circuits forming components of the backplane itself.

Because broad, flat circuit board retained copper traces are employed to transfer regulated power from the power modules to the backplane, the inductance based impedance corrections heretofore required with conventional cabling-based connections are substantially reduced. To achieve this united assembly of power supply and backplane, advantage is taken of the fully defined region specified for the backplanes. In this regard, the power supply footprint at the backplane is essentially coterminus with the border of that fully defined region. For some embodiments of the system, the circuit board component of the power supply is configured with an array of finger projections which extend over the spacing between backplane connector located beyond the fully defined region. This achieves an enhancement of the operational working space of the power supply and its associated heat sink component with arrayed parallel heat transfer fins.

An advantageous feature of the system of the invention resides in the added utilization of the rigid circuit board otherwise carrying power modules to provide supporting circuits and easily accessed connector communications therewith. These connectors permit simplified interactive communication between the user access forward supervisory panels or regions of the housing within which the system is mounted. The supporting circuits and connectors permit simplified wiring for interaction between peripheral components of the system, for example between an on/standby switch at a front panel and a rearwardly disposed front end circuit. These connectors further provide such features as simplified transfer of signals to appropriate terminals of the backplane itself as well as simple connections for remote sensing features of the power module. Where VME type systems are utilized, the supplementing circuitry carried by the common power supply circuit board also provides a prioritization of the regulated 5 v output and the regulated 3.3 volt output which is generated. For most applications, no auxiliary fans are required for the power supply, the conventional heat removal air paths of standard chassis being adequate.

Other objects of the invention will, in part, be obvious and will, in part, appear hereinafter.

The invention, accordingly, comprises the apparatus and system possessing the construction, combination of elements, and arrangement of parts which are exemplified in the following detailed description.

For a fuller understanding of the nature and objects of the invention, reference should be made to the following detailed description taken in connection with the accompanying drawings.

BRIEF DESCRIPTION OF THE DRAWINGS

FIGS. 13A and 13B combine as labeled thereon to provide an electrical schematic diagram of the circuit board mounted circuit of the invention;

DETAILED DESCRIPTION OF THE INVENTION

Figure 1:
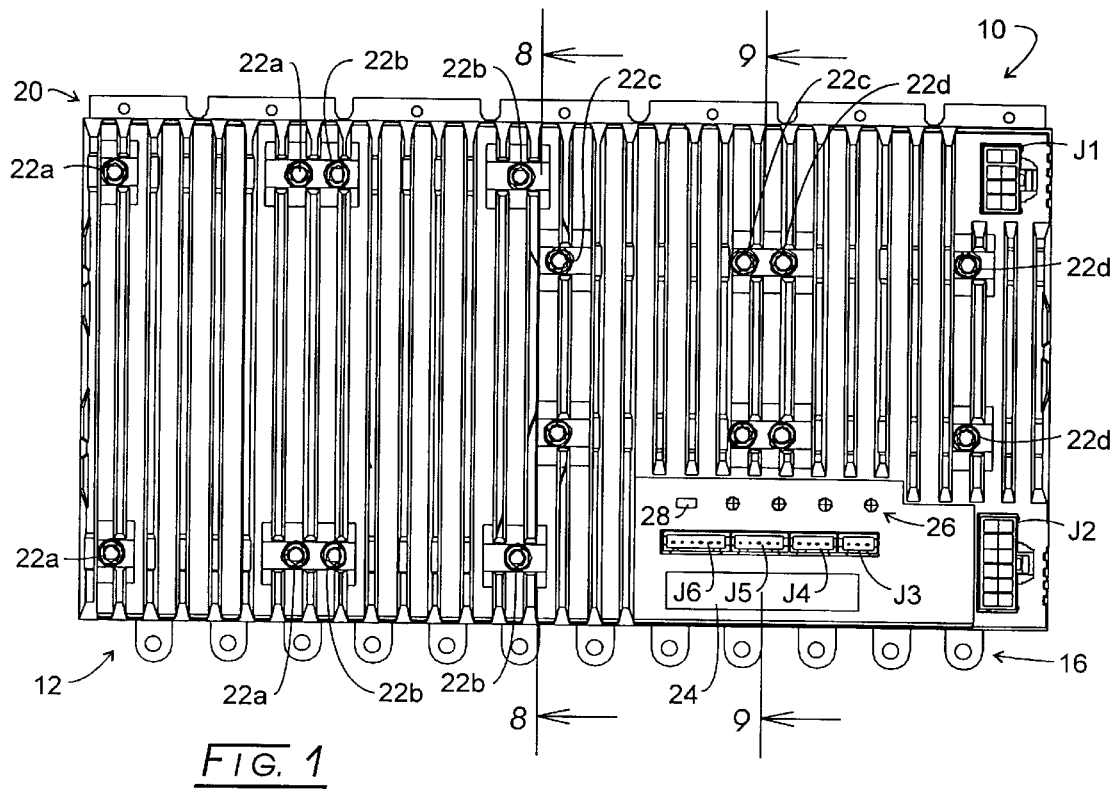
FIG. 1 is a front view of a power supply assembly according to the invention.
Figure 2:
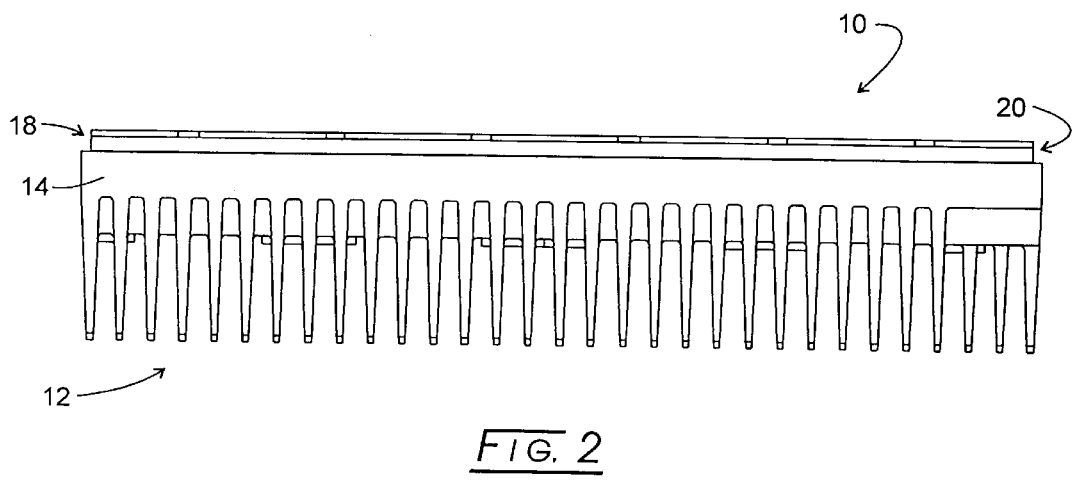
FIG. 2 is a top view of the power supply assembly of FIG. 1.

The power supply assemblies of the invention are configured in conjunction with a selected backplane. In this regard, the assemblies are configured to take full advantage of the rearwardly, outwardly facing surface of such backplane at those spaced apart upstanding power input connectors which are fully defined. In this regard, the user will have no requirement for accessing within the border of those fully defined regions at the rearwardly outwardly disposed side of the backplane. FIG. 1 looks to a power assembly 10 as it would be observed from the rear of a chassis or housing. A typical backplane will be vertically mounted at the rear of a chassis and coupled with forwardly disposed functional circuit boards which, in turn, typically are supported within a "card cage". Basic power is supplied to these housings typically from an a.c. input, however, power also may emanate from a d.c. bus. For the present embodiment, power is supplied to the power supply assembly 10 from a "front end" or input treatment circuit. That front end is coupled to available a.c. power and derives a d.c. power input which is conveyed to assembly 10. The housings preferably also will include a forwardly disposed user accessible panel carrying monitoring readouts, power on switches, reset switches, and the like, which are manually actuated by the user. Finally, the housings typically incorporate cooling fans and associated filtering for providing a heat removal air path which passes through the cards or functional circuit boards and, with the present invention, is given a second function of providing cooling for the assembly 10. The embodiment depicted herein is designed for employment with a VME bus system which will have a J1 connector section of 3U height, a grouping of connector functions for which are fully defined. Thus, device 10 fits within the border of a certain number of the connectors of the connector array within that fully defined region. The side of the assembly 10 shown in FIG. 1 includes an array of parallel cooling fins 12 forming a component of a heat sink which is shown generally at 14. FIG. 2 reveals that this array 12 of cooling fins are integrally formed with a heat sink base portion 15.

Assembly 10 is a composite or "sandwich" type of structure which includes a rigid printed circuit board having an array of finger projections represented generally at 16 which will be seen to be rigidly connected to power bolts extending from an associated backplane. For the embodiment shown, the circuit board is electrically operationally associated with four power converters of the switching type and positioned inwardly adjacent and parallel to the rearward face of the backplane is an inner cover seen generally in FIG. 2 at 18. Inner cover 18 has an array of connector tabs shown generally at 20 intended for connection with the upwardly disposed border of a vertically mounted backplane and further functioning to establish a parallel relationship of the assembly 10 with the rearward surface of the backplane. Connection of the heat sink 14 with the inner cover 18 as well as with associated power converters is by four groupings of connecting bolts shown at 22a–22d.

Access to the assembly 10 is from the rear as represented in FIG. 1. In this regard, an eight terminal input connector is represented at J1 which functions to receive the noted d.c. input, for example from an input treatment or front end circuit. Another connector is represented at J2 which serves to provide output power to peripheral devices such as cooling fans, supervisory circuits, and the like. A system control connector is shown at J3 which functions in connection with supervisory panels of the associated housing and the like. Next to that connector is a connector identified at J4 which functions to provide interactive control to and from the input treatment or front end circuit. A multiple terminal connector J5 provides for facile connection with specified functions of the backplane, and a connector identified at J6 provides for connection from the control terminal assemblies of the d.c.-to-d.c. converters to provide sense signals representing voltage monitoring, for example at the backplane itself. A stress relief fixture is shown at 24 which functions to provide stress relief to the relatively smaller diameter, for example about 20 gauge, wire employed to interconnect the connectors J1–J6 with associated functions. An array of four access openings is shown generally at 26. These access openings provide user access to trim potentiometers mounted upon the rigid circuit board beneath the heat sink 14. Finally, an indicator light emitting diode (LED) is mounted for user observation at 28.

Figure 4:
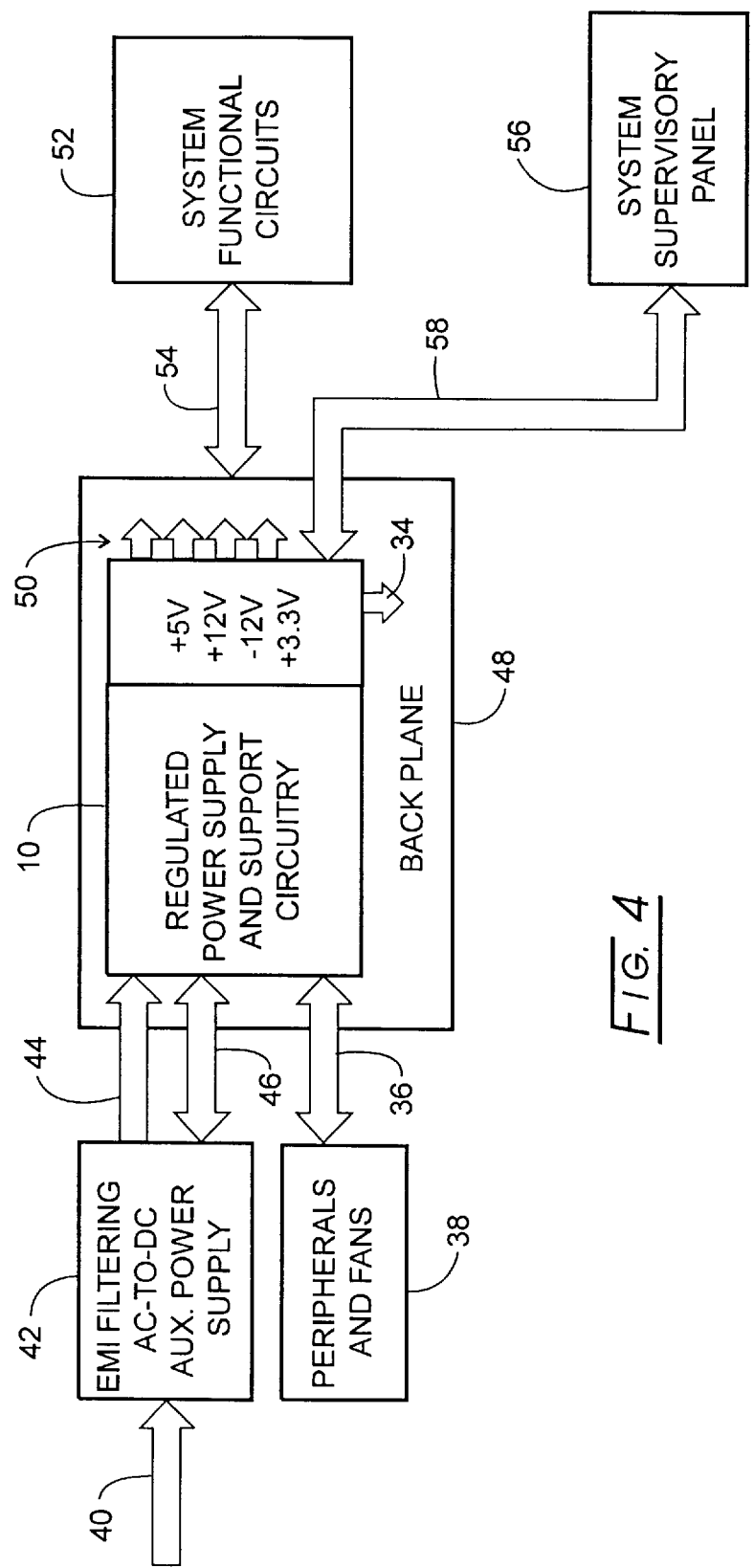
FIG. 4 is a block diagrammatic representation of the power supply and backplane system of the invention.

The system within which the power supply assembly 10 performs is illustrated in block diagrammatic fashion in FIG. 4. Looking to that figure, a power supply input, for example an a.c. supply, is represented at arrow 40 representing a directing of a.c. power to an input treatment circuit or "front end" represented at block 42. Preferably, this input treatment circuit will provide EMI (electromagnetic interference) filtering, an a.c.-to-d.c. conversion which will, for example, convert 120 v a.c. or 240 v a.c. input to a nominally 300 v d.c. output. This output is not regulated, the function of the circuit 42 being to rectify and condition the input. Additionally, the treatment circuit 42 may supply an auxiliary power output, for example at 12 v for powering peripheral devices of the system such as fans and the like. Front end devices suitable or the instant purpose are, for example, the model AR600 or model PFC1600 products marketed by Tracewell Power, Inc. of Westerville, Ohio. The d.c. output is directed to the power supply assembly 10 as represented at arrow 44 and a block identified at 10. In turn, the circuitry 10 functions to interact with the input treatment circuit 42 as represented by arrow 46. The d.c. power input as represented at arrow 41 is directed to the earlier-noted terminal J1, while the input treatment control connector represented at J4 (FIG. 1) functions to provide the control, for example, an on actuation and the like, as represented at arrow 46. That terminal also receives the noted auxiliary power input. Assembly 10 is shown mounted upon a backplane, in turn, represented at block 48, and the assembly 10 is seen, for the instant VME embodiment, to provide outputs of +5 v, +12 v, –12 v, and +3.3 v to the backplane 48 as represented by the arrow array 50. Also, as represented at arrow 34, the circuitry 10 functions to transmit defined signals to the backplane 48 from connector J5. The backplane 48, in turn, functions to service the system functional circuits or cards as represented at block 52 and arrow 54. Additionally seen associated with the power supply assembly 10 is a system supervisory panel as represented at block 56. As noted above, this panel will incorporate an on and off switch, reset switching, and a variety of monitoring functions as are described in U.S. Pat. No. 5,168,171 (supra). The interactive association of supervisory panel 56 and assembly 10 is represented by arrow 58. General outputs to "peripherals" and fans from the circuit 10 are represented by block 38 and arrow 36.

Figure 5:
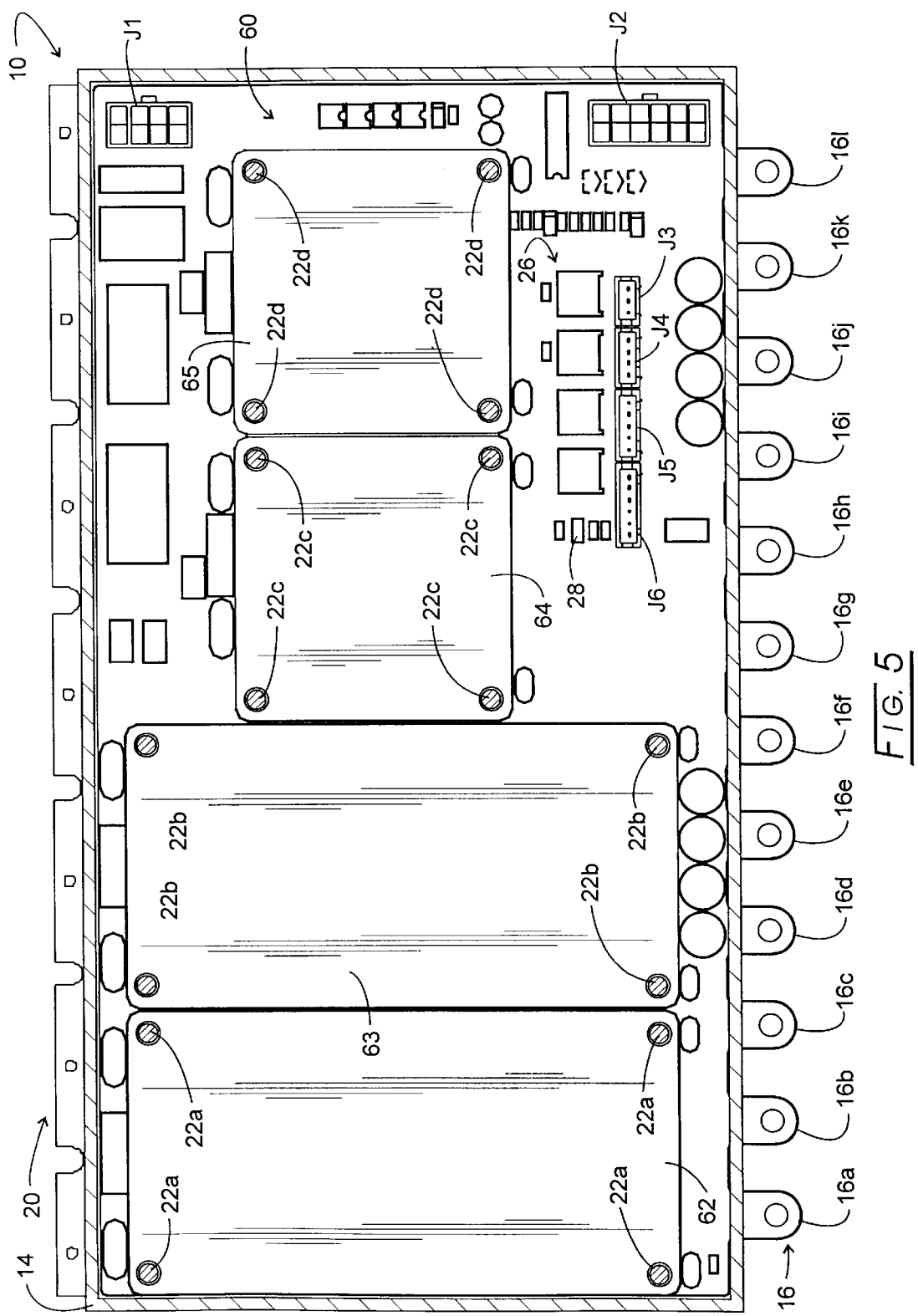
FIG. 5 is a sectional view taken through the plane 5—5 in FIG. 3.

Looking to FIG. 5, the circuit board mounted components enclosed by the heat sink 14 are revealed. This rigid circuit board as represented at 60 is seen to fit within the heat sink 14 and over the inner cover 18, the upstanding connector tabs of which are seen at 20. Bolts 22a as described in connection with FIG. 1 are seen to extend through a first power converter of four such devices shown at 62–65. In similar fashion, converter 63 is mounted by bolts 22b, converter 64 is mounted by bolts 22c, and converter 65 is mounted by bolts 22d. For the instant embodiment, d.c.-to-d.c. converter 62 provides a 3.3 v regulated output at finger projections 16a and 16c by connection to flat or planar leads formed within the circuit board 60. D.c-to-d.c. converter 63 also is connected to such flat or planar leads to provide a regulated +5 v output at finger projections 16d, 16f, and 16h. D.c.-to-d.c. converter 64, which is seen to be of smaller physical size in terms of the surface area revealed, provides a +12 v output at finger projection 16j via planar or flat leads within circuit board 60, and d.c.-to-d.c. converter 65 serves to provide a regulated –12 v output at finger projection 161 via the noted flat planar leads. Return is developed with the devices on flat or planar leads arranged with the circuit board 60 in parallel with the noted power delivery and such return connection with an associated backplane 48 is developed at finger projections 16b, 16e, 16g, 16i, and 16k. The converters 62–65 are shown oriented such that their sheet metal heat sinking surfaces are revealed. These surfaces will be retained in intimate contact with the heat sink 14 by virtue of bolts 22a–22d. This thermal association may be enhanced with a thermally conductive pliable conformal compound. D.c.-to-d.c. converter 62 may be provided, for example, as a type AL80A-300-033F50 marketed by Astec (BSR) Plc, Hong Kong. Correspondingly, d.c.-to-d.c. converter 63 may be provided as a type AL80A-300L-050F40 marketed by Astec (supra) and d.c.-to-d.c. converters 64 and 65 may be provided as type AL60A-300L-120F09 marketed by Astec (supra). Supporting components operationally mounted upon the circuit board 60 are the earlier-noted connectors J1–J6, the array of potentiometers represented at 26 in FIG. 1, and represented in similar fashion in the instant figure, as well as diode 28. Other components carried by the circuit board 60 will include capacitors, fuses, resistors, transistors, and opto-couplers.

Figure 6:
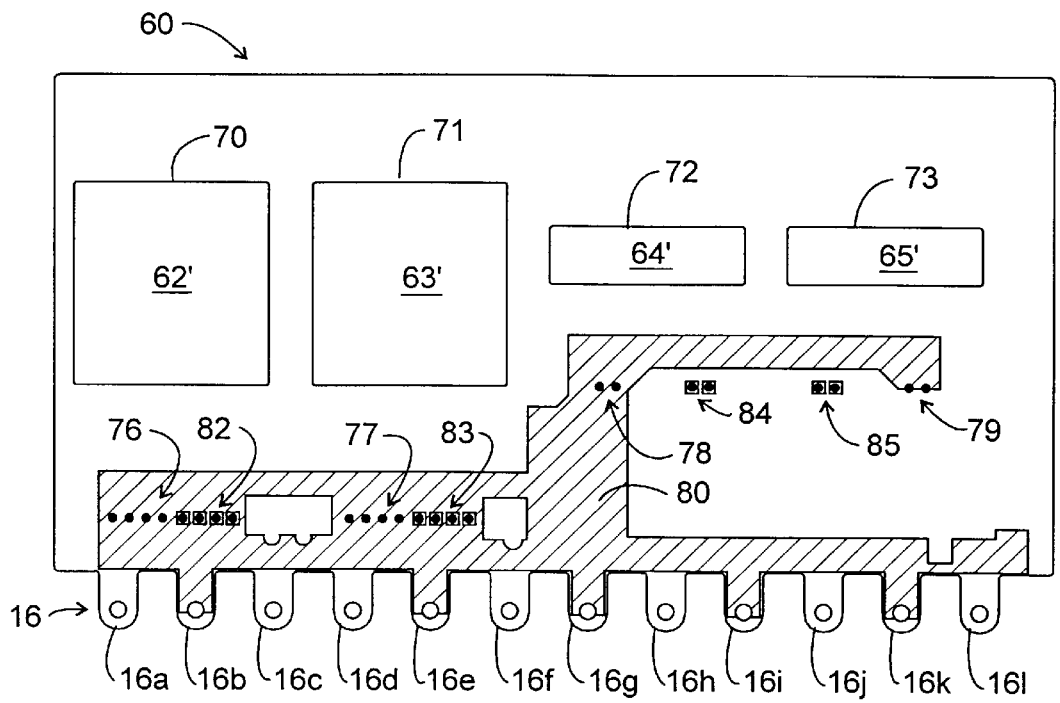
FIG. 6 is a plan view of portions of a circuit board employed with the power supply assembly of the invention, showing flat copper traces.
Figure 7:
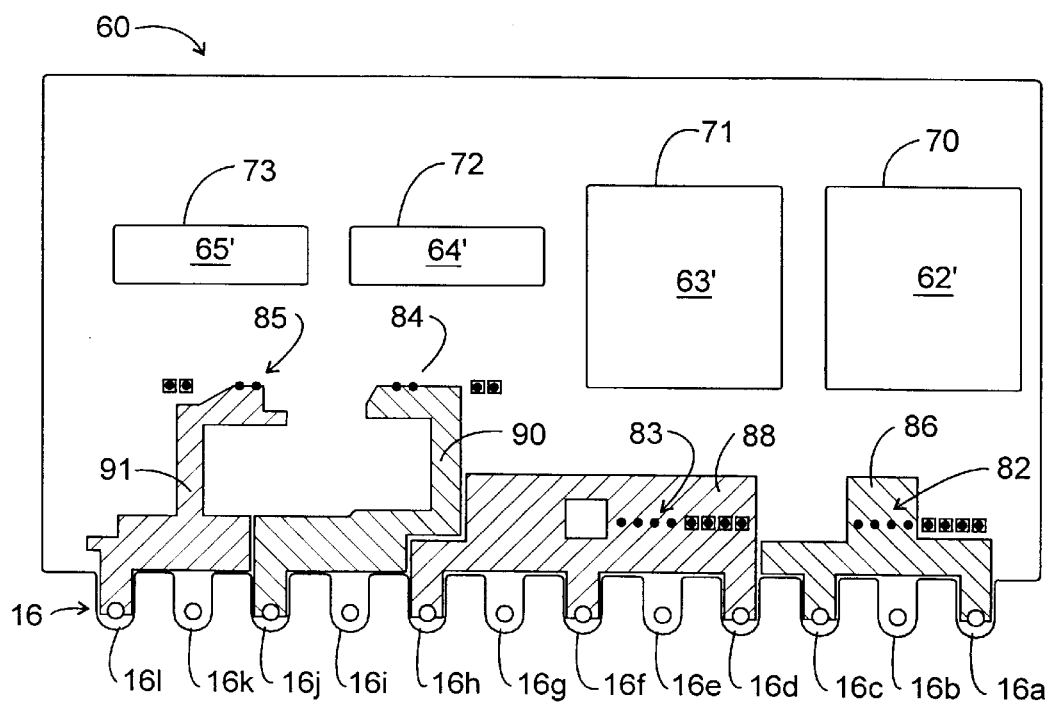
FIG. 7 is a plan view of an opposite side of the circuit board shown in FIG. 6.

As noted above, the regulated output of d.c.-to-d.c. converters such as those described at 62–65 traditionally is conveyed to the backplane by large cables, for example, of wire gauges from 12 to 0, which are terminated by bolting through ring tongue lugs, the bolting requiring controlled torque and these connection having lower than desired reliability due to loosening under vibration phenomena and the like. The cables also invoke an inductance which occurs even in the shortest of cabling runs. Without correction, which also imposes unreliability, current overshoot and undershoot phenomena would occur during pulsed power demands by the functional circuits of the system. With the present assembly, however, no cables are involved and impedance characteristics are minimized by the planar copper leads which extend to finger array 16. Those finger projections of the array 16 are directly bolted through power bolts to the backplane. FIGS. 6 and 7 reveal this ideal planar lead arrangement which is provided by the circuit board 60. These figures are reversed views of the circuit board 60, FIG. 6 showing one side and FIG. 7 showing the opposite side as it would appear to an observer confronting the circuit board. Looking to FIG. 6, the circuit board 60 is seen configured having access openings 70–73 through which a face of the a.c.-to-d.c. converters 62–65 may be observed. To represent the locations of those converters, their identifying numeration is shown in FIGS. 6 and 7 in primed fashion. Return connection is made to power converters 62–65 via soldered connections respectively shown at connection groupings 76–79. Those connections are shown as solid dots. The connections for grouping 76–79 are made to a flat or planar copper lead represented at 80 and seen to extend to fingers 16*b*, 16*e*, 16*g*, 16*i*, and 16*k*. Connector openings are provided through the circuit board 60 for access to its opposite side as shown at connector grouping identifiers 82–85. Looking to FIG. 7, these identifiers now are shown with the same numeration as soldered connections in solid dot form. Note that connector grouping 82 connects the d.c.-to-d.c. converter 62 to a flat planar copper lead 86 which extends to finger projections 16*a* and 16*c* to provide 3.3 v outputs thereat. In a similar arrangement, soldered connector grouping 83 couples d.c.-to-d.c. converter 63 with a flat planar copper lead 88 which is seen to extend to finger projections 16*d*, 16*f*, and 16*h*. These finger projections provide a +5 v regulated output.

Connector grouping 84 is seen soldered to a flat, planar copper lead 90 to provide connection with appropriate output terminals of d.c.-to-d.c. converter 64. The lead 90 extends to finger projection 16*j* to provide a +12 v output. Finally, connector grouping 85 is seen soldered to flat, planar copper lead 91 to provide connection with d.c.-to-d.c. converter 65. Copper lead 91 is seen to extend to finger projection 161 to provide a regulated −12 v output.

Figure 8:
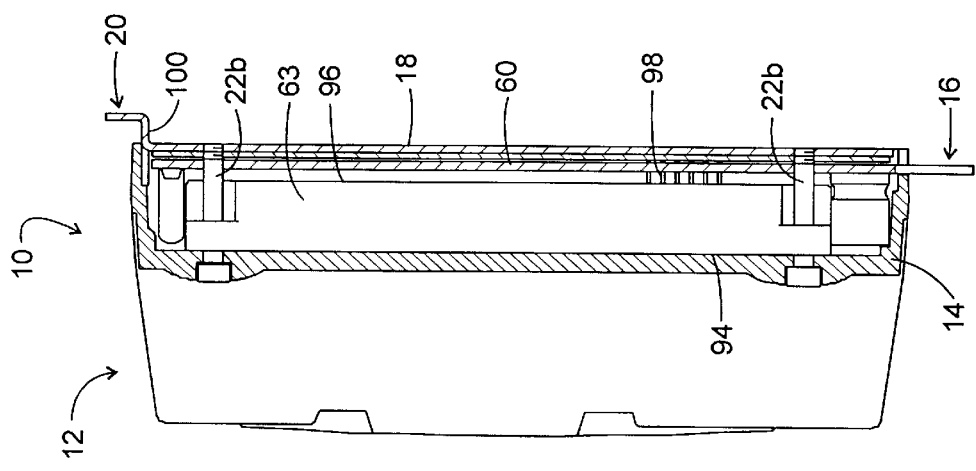
FIG. 8 is a sectional view taken through the plane 8—8 shown in FIG. 1.
Figure 3:
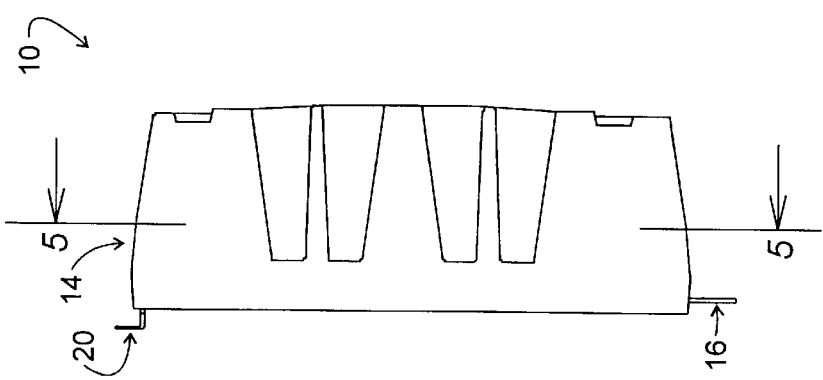
FIG. 3 is a left-side view of the power supply assembly of FIG. 1.

Referring to FIG. 8, a sectional view of the power supply assembly 10 is revealed. In the figure, d.c.-to-d.c. power converter 63 is revealed, being shown connected by bolts 22*b* to the thermal exchange surface 94 of heat sink 14. A frontal view of the corresponding surface of converter 63 is shown in FIG. 5. The opposite surface of converter 63 as at 96 confronts the rigid printed circuit board 60 which, in turn, confronts the sheet metal internal cover 18. That cover 18 serves an added function of providing an electrostatic shield. Each of the d.c.-to-d.c. power converters 62–65 is configured having input terminals, output terminal assemblies, and control terminal assemblies which are accessible from such surfaces as at 96. In this regard, a grouping of leads connecting the control terminal assemblies of device 63 are shown at 98. FIG. 4 additionally reveals the stand-off or spacing arrangement provided by the array of connector tabs as at 20. This extension arrangement is shown at 100 and will be seen to provide for a parallel mounting of the inwardly-disposed surface of the assembly 10 with respect to the rear surface of an associated backplane. Note that the assembly is completed by virtue of the connection of bolts as at 22*b* with inner cover 18.

Figure 9:
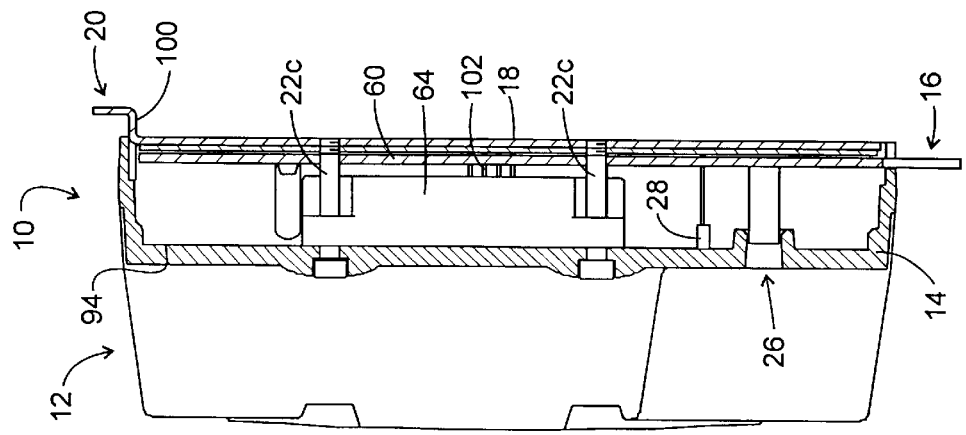
FIG. 9 is a sectional view taken through the plane 9—9 shown in FIG. 1.

FIG. 9 shows the smaller d.c.-to-d.c. converter 64 to be mounted in a similar manner. In this regard, the thermal exchange surface 94 of heat sink 14, is seen in intimately close association with the corresponding converter surface 102. As before, smaller converters as at 64 and 65 will contain input terminals, output terminal assemblies, and control terminal assemblies. A control terminal assembly connection with circuit board 60 is shown as an array 103. As before, bolt connectors 22*c* are threadably coupled with inner cover 18 to provide inter-connection of all components of the composite assembly 10.

Figure 10:
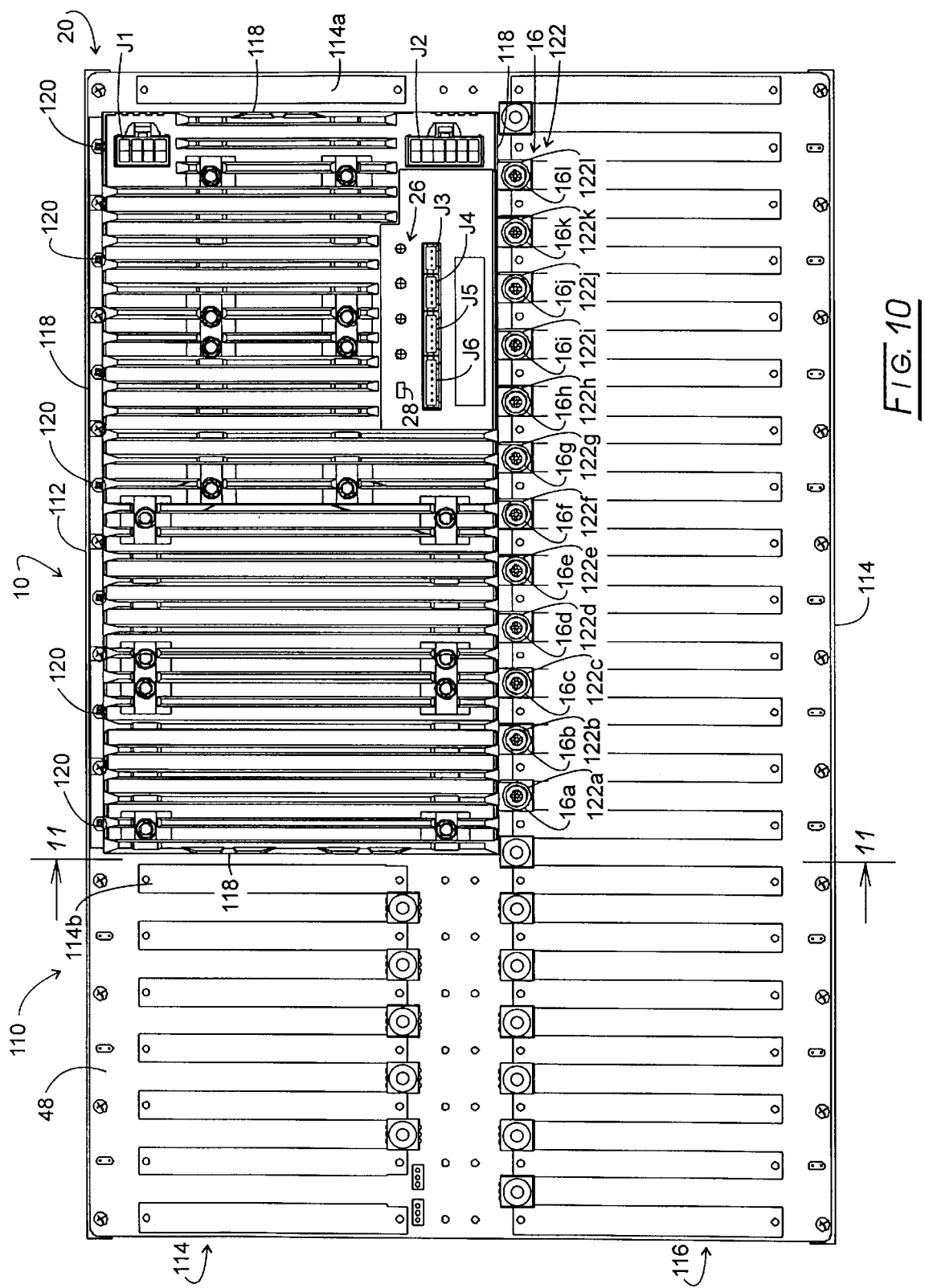
FIG. 10 is a front view of a backplane assembly according to the invention.
Figure 11:
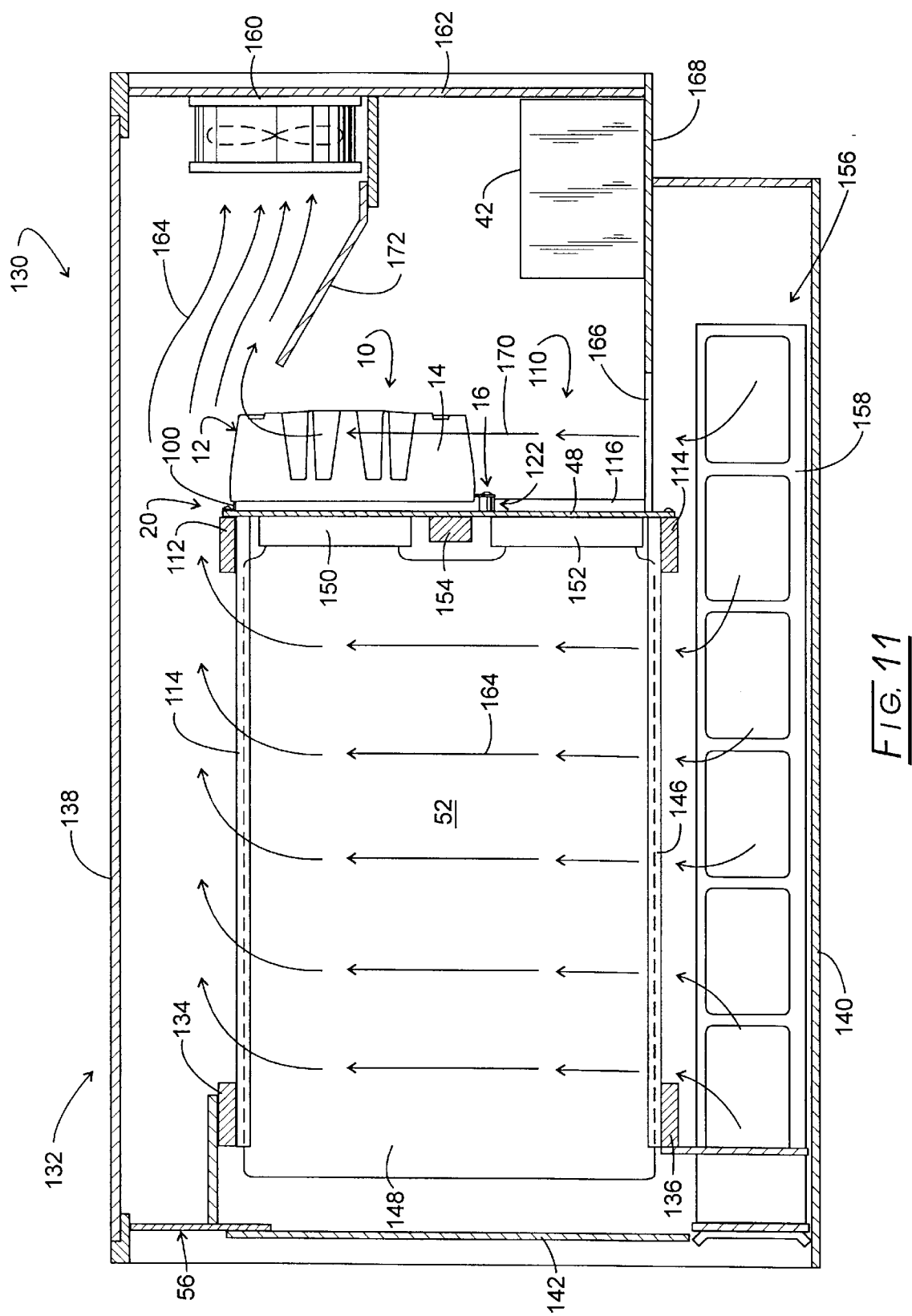
FIG. 11 is a sectional view of a housing within which is mounted a backplane assembly according to the invention.

Referring to FIGS. 10 and 11 a backplane assembly incorporating the power supply assemby 10 is represented generally at 110. In the figure, the earlier-described backplane 48 is illustrated at a higher level of detail. The backplane 48, as illustrated, is configured in accordance with the VME bus specification, that side of the backplane which faces normally rearwardly being shown in FIG. 10, supported between upper and lower struts or supports shown, respectively, at 112 and 114. These supports reappear in conjunction with the backplane 48 in FIG. 11. In general, the backplane 48 is a 6 U panel with two rows of vertically oriented connectors, each of 3 U dimensioning. System cards or system functional circuits earlier described at 52 are connected to the opposite side of the backplane 48 at connectors corresponding with those represented at rows 114 and 116. The power supply assembly 10 is shown mounted at the upper row 114 within a border 118 extending from the upper support 112 downwardly to the bottom of row 114. Additionally, the border extends inwardly one connector width shown at 114*a* across the upper row 114 to a location adjacent connector 114*b*. The border 118 thus encompasses a region for the backplane 48 which is fully defined, no connector pins being present in that region at this side of the board, nor is that region required for operator access. Attachment to the backplane 48 at the upper region is by an array of machine screws, certain of which are identified at 120, extending through the array of connector tabs 20. It may be recalled from the discussion in connection with FIGS. 8 and 9 that those tabs are offset at 100. The arrayed fingers 16 extending from the circuit board 60 within the assembly 10 are connected by bolting to outwardly extending "power bolts" or posts shown arrayed at 122. These power bolts or posts 122 communicate with the circuits of backplane 48 designated for carrying the noted specified regulated power output for the disclosed VME bus specification. The spacing of the connectors for rows 114 and 116 is 0.8 inch. This spacing permits the finger projections 116*a*–116*l* to be positioned within the interconnector spaces for rigid connection with the power inputting posts. In this regard, note that finger projections 116*a*–116*l* are bolted to corresponding posts or power bolts shown, respectively, at 122*a*–122*l*. FIG. 10 also reveals the facile operator access to the connectors J1–J6 as well as to the array of potentiometers 26.

Referring to FIG. 11, a housed system is represented generally at 130 as including a housing 132 within which a card cage or chassis is supported at earlier-described supports 112 and 114 as well as supports 132 and 136. Housing 132 is seen to extend between a top 138 and a bottom 140. A glass or metal access door 142 is provided at the front portion of the housing 132 as well as a supervisory panel earlier described at 56 and identified with that numeration in this figure. The card cage as earlier described at 52 is represented generally with the same numeration and includes a sequence of open, channel-shaped circuit board or card supports provided in an upper array 144, and a lower array 146. A card or circuit board 148 is shown mounted within the assemblage of supports 144 and 146. Note that the mounting is vertical and, typically, a plurality of such functional circuit boards or cards are provided within the housing 132. Cards as at 148 will have connectors at one end which couple to corresponding inwardly depending vertically oriented connectors extending inwardly from the backplane 48. Two such connectors are represented in the figure at 150 and 152 shown at vertically opposite sides of a horizontal support or strut 154. Beneath the card supporting region 52 is located an air circulation plenum represented generally at 156. Ambient air is drawn into the plenum 156 through air entry ports (not shown) located adjacent an elongate filter, one of which is shown at 158 positioned along the lower sides of housing 132. A cooling air path is established by a multiple fan assemblage represented generally at 160 which functions to draw air through the interior of the housing from the plenum 156 and outwardly through grates (not shown) in the rearward wall 162 of housing 132. The main air path is represented by arrows, certain of which are identified at 164. Additionally, an opening for an auxiliary air path is provided at 166 present in a lower panel 168. Opening 166 is in communication with the plenum 166 and provides for air flow as represented at path arrow 170 which passes through the vertically oriented fins 12 of the heat sink 14. Note, additionally, the presence of a baffle 172 functioning to direct air through the arrayed vertical fins 12 of the assembly 10. Additionally, a front end or input treatment circuit as earlier described at 42 is represented beneath the fan assemblage 160 and is identified by the same numeration. FIG. 11 also shows the array of power bolts or posts 122 as extending outwardly from the connector row 116 for connection with the corresponding array of finger projections 16. Note additionally that the tabs 20 of the inward cover 12 and the extension arrangement 100 function to position the inner surface of assembly 10 in parallel with the adjacent surface of the backplane 48. The arrangement, in effect, accommodates for the height of the regulated power input posts arrayed at 122. Note in the figure that the posts extend slightly above the outwardly extending connectors of connector row 116. An advantage which is achievable with the backplane assembly 110 is a reduction in the overall front-to-back depth of the housing 132. While not shown in the instant illustration, it becomes apparent that the rear wall 162 may be moved forwardly to provide important savings in the space otherwise occupied by the system 130.

The facile access of the connectors J1–J6 with various associated components of the system 130 becomes apparent from the drawing. With that rear access, for example, relatively thinner wiring may be provided between the input treatment circuit 42 and the assemblage end. Similarly, the auxiliary power input for the fan assemblage 160 is readily provided from the assembly 10. Electrical lead communication between the supervisory panel 56 and appropriate connectors at assembly 10 is readily installed and the sensing components as well as communication with the backplane 48 are readily configured and electrically attached to the assembly 10. The large and troublesome cabling heretofore employed with the systems as at 130 has disappeared.

Figure 12:
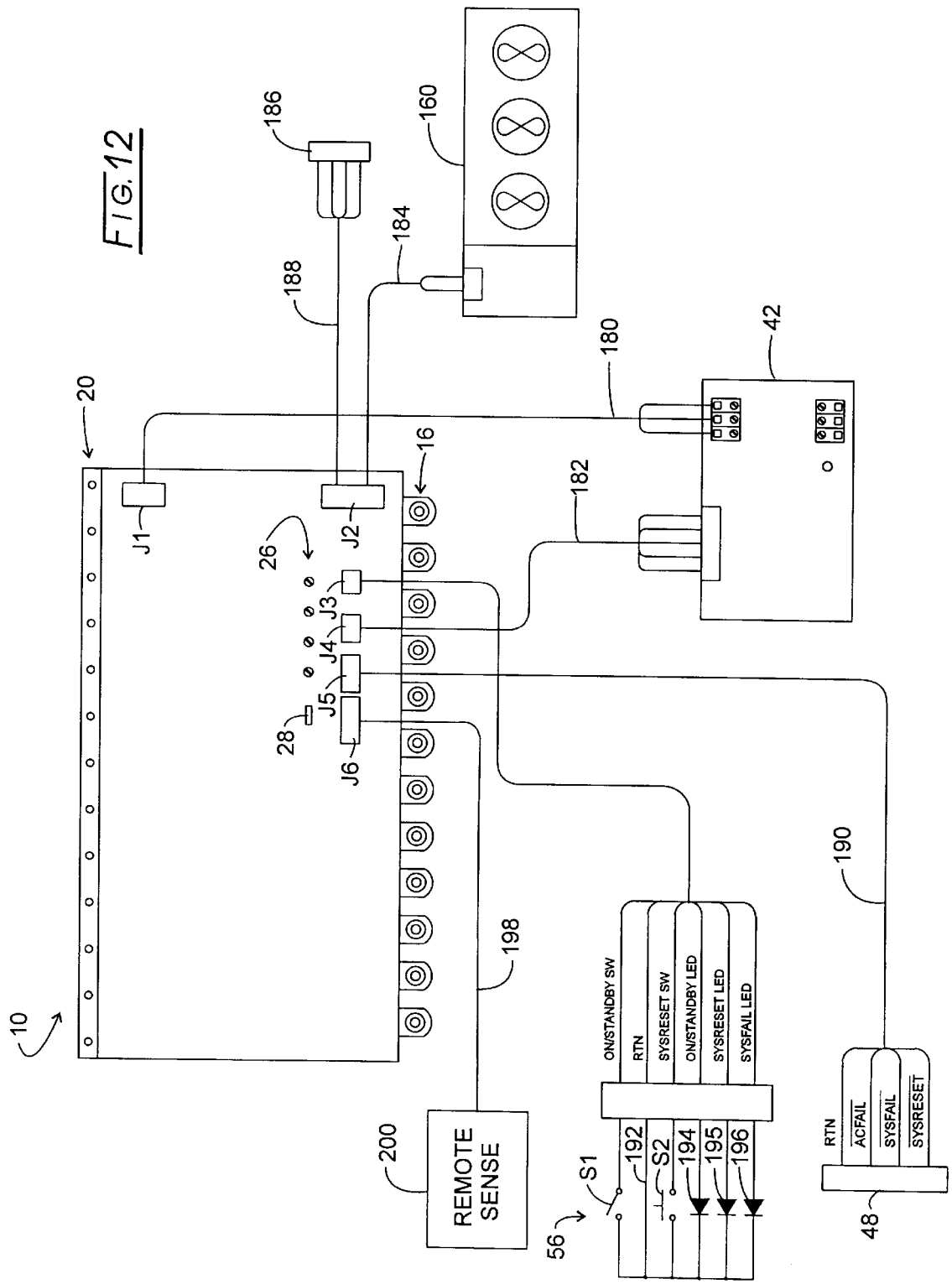
FIG. 12 is a schematic representation of circuit interconnections made in accordance with the system of the invention.

Looking to FIG. 12, the utilization of the readily accessible connectors J1–J6 with the backplane, supervisory portion, peripherals such as fans and the like, and the front end input treatment circuit is schematically portrayed. In the figure, the power supply assembly 10 is shown with a representation of the inner cover tabs 20 and the finger projection array 16. The connectors J1–J6 are represented in block fashion and the access regions for the potentiometer array 26 and LED 28 are shown. Note that power input communication is shown being directed from the input treatment circuit 42 as represented by line 180. Interactive communication with the treatment circuit 42 is provided from connector J4 as represented at line 182. Connector J2 is seen providing peripheral power at +12 v, –12, return and +5 v for the purpose of powering the fan assemblage 160 as represented at line 184 and for providing powering service to other peripherals at 186 as represented, in turn, at line 188. Interactive communication with the backplane 48 is provided from connector J5 as represented at line 190. The user accessible system control location as described at panel 56 is represented with the same numeration in the instant figure. In this regard, an on/standby switch is provided at S1, a return input is provided at line 192, a momentary reset switch is provided at S2, and an on/standby LED indicator, a system reset LED indicator, and a system fail LED indicator are respectively provided by LEDs 194–196. Finally, connector J6 provides remote sense communication of certain of the d.c.-to-d.c. power converters with monitoring locations typically provided at the backplane. This arrangement is represented by line 198 in conjunction with block 200.

Figure 13A:
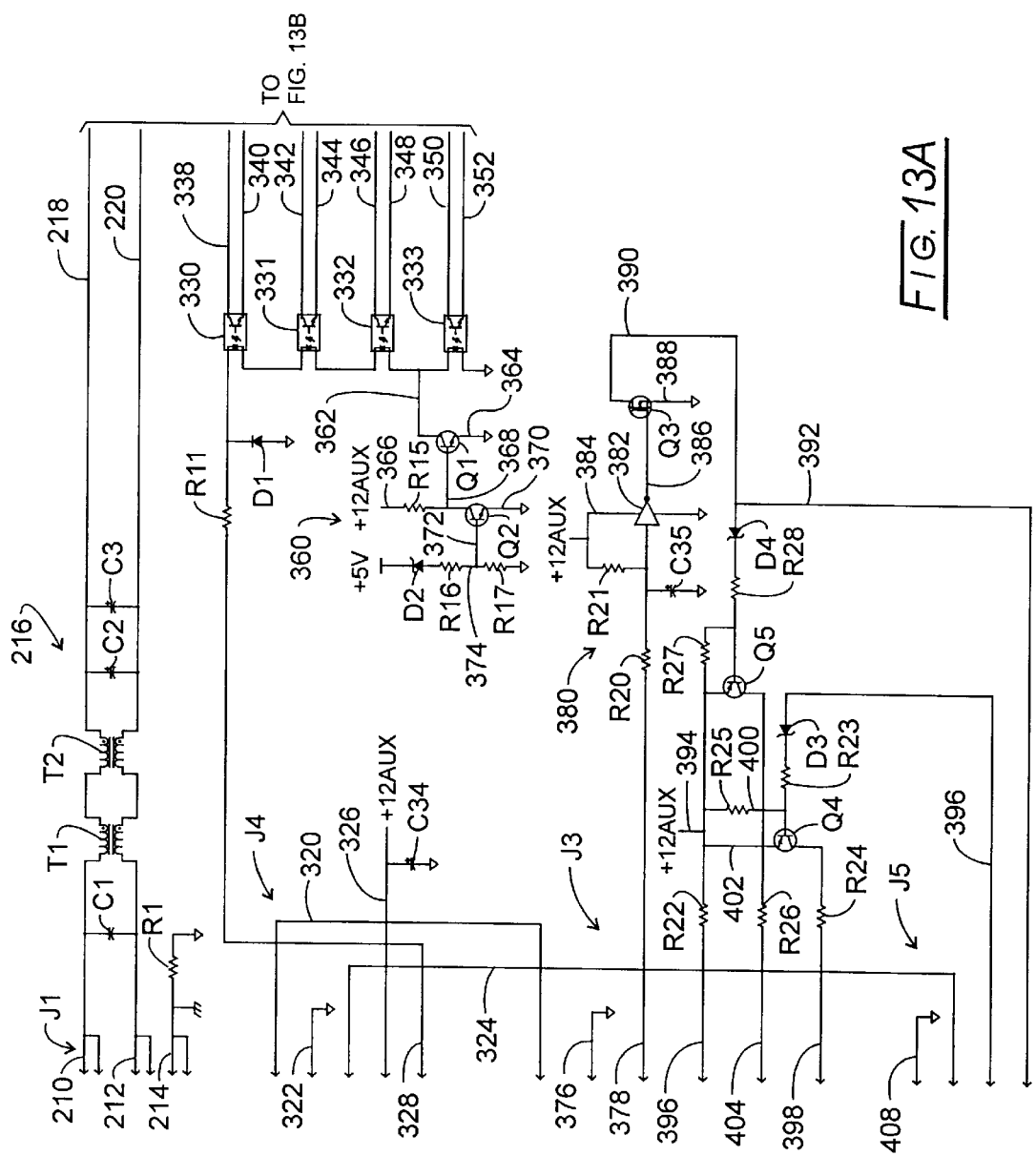

An electrical schematic diagram of the circuitry carried by printed circuit board 60 is provided in conjunction with FIGS. 13A and 13B which should be considered together in the manner labeled thereon. In FIG. 13A, the active components of connector J1 are revealed. In general, an eight terminal connector is utilized having four paired terminal connections. Two of these paired connections are utilized for spacing purposes. Such spacing accommodates for the high (about 300 v) d.c. input supplied from the input treatment circuit 42 for most applications. The system is designed to accommodate a d.c. input ranging from about 180 to 400 v. Other applications, for example in telephony by the d.c. input of about 48 v with concomitantly higher current requiring the utilization of parallel pin connections. Thus, accommodation is made for both applications. Assuming the former application, about a 300 v d.c. input is applied at the dual inputs to line 210 of connector J1 while a corresponding return is coupled at line 212 and, finally ground is provided at line 214 incorporating resistor R1. D.c. input applied at lines 210 and 212 at the outset, is subjected to EMI filtering in conjunction with inductors T1 and T2 as well as capacitors C1, C2, and C3. Filter 216 functions to eliminate some of the electrical noise generated by the switching converters 62–65. The resultant filtered output, now at lines 218 and 220, is directed to the d.c. inputs of converters 62–65. In this regard, looking additionally to FIG. 13B, line 218 is seen to incorporate a fuse F1 and extends to the +VIN terminal of power converter 63. Correspondingly, line 220 extends to line 222 which, in turn, is coupled with the –VIN terminal of device 63. Lines 218 and 222 also are coupled to a second EMI filter 224 comprised of capacitors C4, C5, and C6 which perform in conjunction with an inductor located at the inputs of device 63.

Looking to power converter 62, line 218 is seen to extend via lines 226 and 228 to the +VIN input to device 62, line 228 incorporating a fuse F2. Correspondingly, line 220 is seen to extend to line 230 which, in turn, is connected to the –VIN terminal of device 62. As before, an EMI filter 232 is provided which is comprised of capacitors C7–C9 and inductors at the input device 62. Line 226 is seen additionally to extend to line 234 which is coupled to the +VIN terminal of power converter 64 while line 220 extends to line 236 which is coupled to the –VIN terminal of device 64.

Line 234 incorporates a fuse F3 and an EMI filter 234 is provided comprised of capacitors C10–C12 and inductors at the input of device 64. Finally, line 226 is seen to incorporate a fuse F4 and extend to the +VIN terminal of power converter 65, while line 220 extends to the –VIN terminal thereof. An EMI filter 238 comprised of capacitors C13–C15 and inductors at the input of device 65 additionally is provided. With the arrangement shown, there is a high voltage unregulated d.c. input to each of the d.c.-to-d.c. power converters 62–65. In general, these devices 62–65 are of a pulse width modulated (PWM) switching variety. Each of these modules 62–65 also contains a control terminal assemblage which includes enable inputs and clock in (CLKIN) as well as clock out (CLKOUT) terminals. Further, the devices generally incorporate, inter alia, +SENSE and –SENSE terminals as well as a voltage adjust terminal (VADJ). These additional terminals are employed, for example, for synchronizing the frequency of one power converter with that of others, to twin-control current or voltage, or to enable them for utilizing the unregulated d.c. inputs.

The positive and negative regulated voltage outputs of power converter 63 are provided at respective lines 240 and 242. This output terminal assembly provides a regulated +5 v output at line 240 and a return function at line 242. An EMI filter comprised of capacitors C16 and C17 and inductors at the terminal assembly further is provided. Additionally, inasmuch as a minor ripple may be associated with this regulated output, correcting filter capacitors C18–C21 are coupled to the output. It may be noted that the +5 v regulated output is tapped at line 246 for use elsewhere in the circuit.

It may be recalled from the discussion provided in connection with FIGS. 6 and 7, that the return made available at line 242 is coupled to a broad copper trace 80 while the +5 v output is coupled to a broad or extensive surface area copper trace 83. Those copper traces extend to corresponding finger projections of array 16. Such an arrangement accommodates for the higher currents involved, the wide and flat geometry of those traces achieving delivery of current with much lowered inductance as opposed to conventional cabling. Additionally, where the return traces are closely adjacent and parallel to the regulated output traces, inductance is lowered still further because of the close parallel spacing of these conductive planar regions. This arrangement is quite important for power supply purposes, inasmuch as it permits the system to readily accommodate to load surges as are typically encountered during memory accessing procedures. The capacitors at the output also contribute to accommodating these load variations by providing a low impedance energy storage function.

The output terminal assembly of power converter 62 is structured similarly. In this regard, a line 260 is coupled to the +V OUT terminal, while line 262 is coupled to the –V out terminal. An EMI filter 264 comprised of capacitors C20 and C21 performing in conjunction with inductors at the output terminals is provided as before. Additionally, filtering capacitors C22–C25 perform in the manner of capacitors C18–C21. The resultant regulated +3.3 v output at line 260 is coupled to earlier-described copper trace 86 (FIG. 7), while the return provided at line 262 is coupled to the earlier-discussed return planar lead 80 (FIG. 6). It may be observed that the +SENSE terminals of power converters 62 and 63 extend via respective lines 266 and 268 to the J6 terminal. Additionally, the –SENSE terminal of device 62 is coupled to line 270 which extends to line 266 and incorporates resistors R2–R4, resistor R3 thereof being provided as a potentiometer with a wiper arm at line 272 extending to a voltage adjust (VADJ) terminal of device 62. The latter resistive adjustment constitutes the earlier-described trim arrangement 26a. An additional line 274 is seen to couple line 270 with connector J6. In similar fashion, the –SENSE terminal of power converter 63 is coupled to line 276 incorporating resistors R5–R7, whereupon it is coupled to line 268. Resistor R6 is a variable resistor or potentiometer at line 278 which, in turn, is coupled to the voltage adjust (VADJ) terminal of device 63. Line 276 is coupled via line 280 to line 274 to provide a common connection at connector J6.

The +VOUT terminal of power converter 64 is seen coupled to line 282 while the corresponding –VOUT terminal thereof is coupled to line 284. As before, an EMI filter 286 is provided at this output which comprises capacitors C26 and C27 performing in conjunction with induction at the output terminals. Filtering is provided by capacitors C28 and C29, and the +12 v output at line 282 is tapped at line 288. Lines 282 and 284 extend, as discussed in connection with FIGS. 6 and 7 to planar and large surface area copper traces as described, respectively, at 84 and 80. The +SENSE and –SENSE terminals of device 64 are coupled to line 290 incorporating resistors R8 and R9, the latter being a variable resistor or potentiometer with a wiper arm at line 294 coupled to the voltage adjust (VADJ) terminal of device 64. The +SENSE and –SENSE terminals additionally are coupled to respective lines 282 and 284 by respective lines 296 and 298 to provide a voltage adjustment network.

The +VOUT and –VIN terminals of power converter 65 are coupled to lines 300 and 302 providing respective return and –12 v outputs. An EMI filter 304 comprised of capacitors C30 and C31 performing in conjunction with induction at the output terminals is provided. Additionally, filtering is developed with capacitors C32 and C33. Line 302 is tapped at line 306 to provide for the provision of –12 v to other components of the circuit. The +SENSE and –SENSE terminals of device 65 are coupled to line 308 incorporating resistors R10 and R11, the latter being a variable resistor or potentiometer having a wiper arm at line 310 extending to the voltage adjust (VADJ) terminal of device 65. The +VOUT terminal is coupled via line 312 to the +SENSE terminal, while the –VOUT terminal is coupled to the –SENSE terminal via line 314.

Return line 300 extends to earlier-described planar copper trace 80, while line 302 is coupled to planar copper trace 91.

Returning to FIG. 13A, it may be recalled that the J4 connector is an input treatment control connector functioning with the front end device 42 (FIG. 4). In this regard, line 320 of the connector is connectable with that component 42 and extends as a component of the printed circuit to system control connector J3 which is connectable, for example, to the system supervisory panel 56 to convey the on/standby switch condition therefrom. Line 322 at connector J4 is a return line. Line 324 provides a signal from the device 42 indicating whether or not a.c. power is lost. This line 324 extends via the printed circuit 60 to connector J5 for purposes of conveying that condition to the backplane. Line 326 of connector J4 carries the +12 aux auxiliary voltage for utilization by the circuit. This voltage is filtered by a capacitor C34.

Line 328 of connector J4 carries an enable signal from the input treatment circuit 42 which appears when the unregulated d.c. voltage therefrom reaches a specified level. This occurs following the receipt by that front end component of the on standby switch actuating condition at line 320. The resulting enable signal ultimately extends to the corresponding enable terminals of power converters 62–65. However, it may be observed that line 328 incorporates a resistor R11 and extends to serial connection with the input sides of four optocouplers 330–333. This arrangement is provided to "bring up" or energize the power converters 62–65 substantially simultaneously, i.e. within about a 10 ms tolerance. Without this feature, faults or failures could occur. For additional protection, a diode D1 is provided to avoid the consequences of a reverse coupling.

Looking additionally to FIG. 13B, line 338 at the output of optocoupler 330 is seen to extend to the enable input terminal of device 63 while the second output line 340 thereof extends to the return sense line 276. In similar fashion, output line 342 of optocoupler 331 extends to the enable terminal of power converter 64 and the second output thereof at line 344 extends to the –SENSE terminal of device 64 at line 290.

The output of optocoupler 332 at line 346 extends to the enable terminal of power converter 65, while the opposite output of optocoupler 332 at line 348 extends to the –SENSE terminal of device 65 at line 308.

One output of optocoupler 333 extends via line 350 to the enable terminal of power converter 62. It may be recalled that this converter 62 provides a regulated 3.3 v output. The opposite output of optocoupler 333 at line 352 extends to the –SENSE terminal of device at line 270.

Because the present embodiment of the system includes both a regulated 3.3 v and a regulated 5 v output, it is necessary to provide a prioritization network to assure no conflict between these features. In this regard, should the 5 v regulated output fail or disappear, it is necessary to forthwith disable the 3.3 v output. Additionally, it is important that the regulated 5 v output be established, prior to the development of the 3.3 v output. This condition is unique to current VME and VXI systems.

FIG. 13A shows the presence of such a prioritization network at 360. Network 360 includes an NPN transistor Q1, the collector of which is coupled via line 362 to the input of optocoupler 333. The emitter of transistor Q1 is coupled to ground through line 364. Thus, the transistor Q1 is coupled in shunt about the input to optocoupler 333 which, as discussed above, is associated with the 3.3 v regulated output of power converter 62. Network 360 additionally includes a biasing resistor R15 coupled within line 366 which is coupled to +12 aux and through line 368 to the base of transistor Q1. Line 366 additionally is coupled to the collector of an NPN transistor Q2, the emitter of which is coupled to ground via line 370. The base of transistor Q2 is coupled via line 372 to line 374 intermediate divider resistors R16 and R17. Line 374 additionally extends through a Zener diode D2 to +5 v, for example as tapped at line 246 (FIG. 13B). With the arrangement shown, forward bias is applied to the base of transistor Q1 thereby holding optocoupler 333 off until transistor Q2 is forward biased by the presence of +5 v at line 374. Thus, power converter 62 cannot be enabled unless +5 v is present at tap line 246 at the output of power converter 63.

Returning to FIG. 13A, system control connector J3 is seen to include the earlier-described input from the on/standby switch at the supervisory panel 56. The connector additionally includes a return terminal represented at line 376. Line 378 of the terminal carries a system reset condition emanating from the momentary depression of switch S2 at to the front panel 56 (FIG. 12). This signal at line 378 is directed through a buffer network 380 which, inter alia, provides for debouncing of the switch actuation. Network 380 includes resistor R20 and capacitor C35 which are provided at the input to an inverting Schmitt trigger 32. A+12 aux input is provided to device 382 via line 384 incorporating resistor R21. The output of device 382 at line 386 will be a pulse of fixed width of about 200 ms which is directed to the gate of a MOSFET Q3. The source of device Q3 is coupled to ground via line 388, while the drain thereof is coupled via lines 390 and 392 to backplane connector J5 for assertion to an appropriate terminal at the backplane. This provides a "SYSRESET" system signal. As described at 194–196 in connection with FIG. 12, on/standby, SYSRESET, and SYSFAIL light emitting diodes (LEDs) may be provided at the supervisory panel 56. When this system is turned on, the +12 aux output of the input treatment circuit 42 is delivered and applied via line 394 through resistor R22 and line 396 to the front panel LED 194. Should a system fail condition, which is low logic true, occur at the backplane 48, that condition will be present at line 396 as collected at connector J5. Line 396 extends through a Zener diode D3 and resistor R23 to the base of PNP transistor Q4, the collector of which is coupled to line 398 incorporating resistor R24 and extending to LED 196 at the front supervisory panel 56. Transistor Q4 is normally off by virtue of the assertion of +12 aux to the base thereof via line 400 incorporating a resistor R25. The emitter of transistor Q4 is seen coupled to +12 aux at line 396 via line 402. In similar fashion, the system reset LED 195 is coupled to line 404 of connector J3 which incorporates a resistor R26 and extends to the collector of PNP transistor Q5. The emitter of transistor Q5 is coupled to line 396 which extends through resistor R27 to line 390 which is coupled to the base of transistor Q5 and incorporates Zener diode D4 and resistor R28. Thus, transistor Q5 is normally held off by the input from resistor R27 and is turned on upon a momentary low true pulse emanating from line 390.

Backplane connector J5 additionally is seen to include a return terminal as represented at line 408.

The peripherals connector J2 is not illustrated. This connector is coupled to the tapped regulated output voltages +5 v, +12 v, and –12 v as well as return. Additionally, the diode as described at location 28 in FIG. 1 is energized through a resistor from the tapped +5 v regulated output to develop a "d.c. okay" visual indication.

Returning to FIG. 13B, the frequency coordinating features for the operation of power converters 62–65 are revealed. In this regard, note that the CLKOUT terminal of device 63 is coupled via line 410 to the CLKIN terminal of device 65 and through connecting lines 412 and 414 to the CLKIN terminals of respective power converters 62 and 64.

Figure 14:
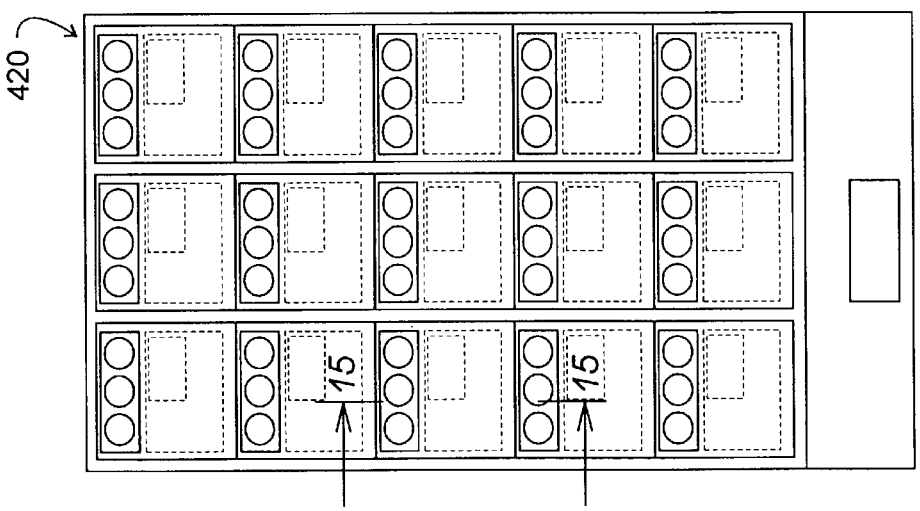
FIG. 14 is a rear view of a plurality of rack mounted chassis incorporating backplane assemblies according to the invention.

A substantial reduction in packaging volume is achieved with the system of the invention. This particularly becomes apparent where the card carrying chassis supporting circuit cards and the backplane and power supply system of the invention are provided. Such a rack is represented in general at 420 in FIG. 14 which is seen carrying an assemblage of 15 chassis mounted systems. These systems are cooled by a push-pull fan arrangement, three fans being positioned adjacent each of the housings or chassis within the rack 420. FIG. 14 is a rear view of such a rack showing the pulling or withdrawing fan at the top of each rack as well as the backplane/power supply system of the invention in phantom.

Figure 15:
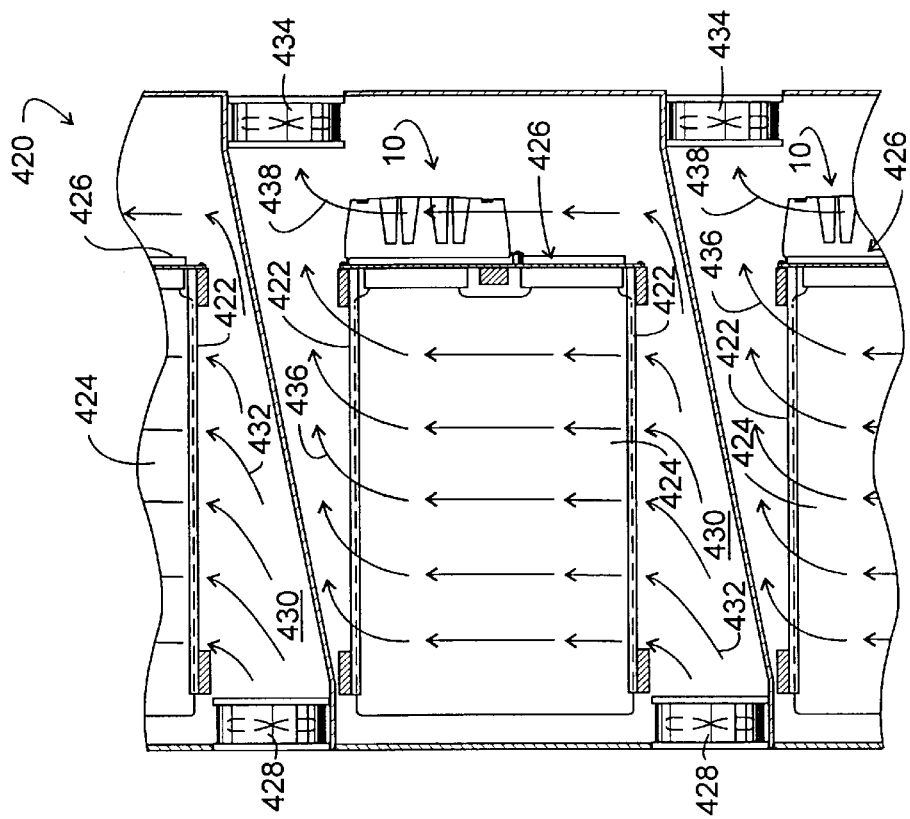
FIG. 15 is a sectional view taken through the plane 15—15 shown in FIG. 14.

Looking additionally to FIG. 15, circuit board supporting channels are shown at 422 supporting cards or functional circuit boards 424 which are coupled to backplane/power supply systems according to the invention as represented at 426. Inputting fans as at 428 draw ambient air into lower plenum 430 as represented by arrows, certain of which are shown at 432. The air path is further defined by draw-through fans as at 434 which draw the inputted air upwardly across the functional circuit board as represented by arrows, certain of which are identified at 436 and, additionally, as represented at arrow 438, across the power supply assembly 10 in a manner earlier described. It may be observed from FIG. 15 that a substantial savings in the bulk of rack 420 is made available by the elimination of cabling and the relatively diminutive size of the devices 10.

Because of the relatively limited size restraints as indicated by the border of the fully defined region of the power plane, evaluations were carried out to determine the presence of acceptable heat sink performance, for example, with a VME bus system backplane. Such evaluations led to the design of the heat sink 14 and associated pin array 12. Calculations were carried out to determine fin size and spacing, whereupon prototype testing was carried out within a conventional housing. For a somewhat standardized backplane assembly 110, having a regulated 5 v and 12 v output, the output power, $P_{out}$ was computed as follows:

$$\text{Pout} = (5V \times 60A) + (12v \times 16A) = 492w \text{ (round to 500)} \quad (1)$$

The corresponding input power, $P_{in}$ was computed as follows:

$$P_{IN} = \frac{300w}{0.82} + \frac{192w}{0.84} = 365 + 229 = 594w \quad (2)$$

A dissipated power, $P_{DISS}$ was then generally estimated from equations (1) and (2) as being about 94 watts. The maximum temperature at which the heat sink should operate was selected as 75° C., 85° C. being the maximum internal temperature reached by the power converter devices. Ambient temperature, $T_a$ was selected as 50° C. and that provided a temperature differential $\Delta T$ of 25° C.

For the above criteria, the heat sink performance or thermal impedance for the surface area $R_{tsa}$ is as follows:

$$R_{tSA} = \frac{\Delta T}{P_{DISS}} = \frac{25° C.}{94w} = 0.27° c/w \quad (3)$$

Knowing the length, l, of the heat sink as longitudinally determined along the fins and the velocity in linear feet per minute of the cooling air, the requisite surface area for the heat sink may be developed as follows:

$$SA = \frac{880\sqrt{l}}{R_{tSA}\sqrt{v}} = \frac{880\sqrt{5.25''}}{(0.27° C./w)\sqrt{700/fm}} SA = 282\text{in}^2 \quad (4)$$

With the above information developed, a prototype heat sink was milled from a block of aluminum in a manner providing for 302 square inches of fin area. The heat sink had a base configuration or footprint of 5.25×7.75 in.

A testing procedure was carried out utilizing a conventional backplane and card supporting chassis identified as a "System 21" marketed by Tracewell Systems, Inc. of Westerville, Ohio. The results of this testing are revealed in Table 1 below.

TABLE 1

AIR FLOW TESTING

| | CFM in System 21 | | | | | |
|---|---|---|---|---|---|---|
| | Card Cage | | | Backplane | | |
| | L | M | R | L | M | R |
| 1. card cage tip blocked | | 50 | LFM | 800 | 1000 | 910 |
| 2. card cage top pen | 120 | 140 | 200 | 730 | 750 | 500 |
| 3. card cage top open, full of boards | 70 | 70 | 110 | 700 | 740 | 600 |
| 4. milled heat sink on VMEPP | no change | | | 650 | 650 | 760 |
| 5. every other board removed | no change | | | 700 | 650 | 700 |

The numerical values given in Table 1 are in linear feet per minute. Utilizing a hot wire anemometer, the flow of air within the chassis was evaluated both at the top of the card cage and at the top of the backplane. Air flow measurements (LFM) were selectively taken at the leftmost (L), middle (M), and rightmost (R) of the card cage and backplane. Row 1 of Table 1 indicates that the card cage top was blocked and that the relatively low air flow at the top of the card cage was measured at the middle thereof. Correspondingly, relatively higher air flow was measured at the top of the backplane. No prototype heat sink was installed for these measurements.

At line 2, the top of the card cage was open and no circuit boards were within the card cage. The resultant air flow measurements are shown and the corresponding measurements taken at the backplane are revealed.

At line 3 of Table 1, the card cage top was opened and the card cage itself was loaded with circuit boards. The results are as recorded.

At line 4 of Table 1, the card cage remained fully loaded with circuit boards and the prototype or milled heat sink was mounted upon the backplane. No significant change was noted in air flow at the top of the card cage and the air flow at the backplane, now containing the milled heat sink, was measured as shown.

At line 5 of Table 1, measurements are shown where conditions were every other circuit board was removed from the card cage. The top of the card cage was opened and no significant change in air flow at the top of the card cage over the values at line 3 were observed. The resultant air flow at the backplane, which incorporated the milled heat sink are as recorded.

The above air flow values at the backplane were found to be satisfactory. Temperatures recorded at the narrow heat sink prototype were satisfactory, ranging from 34° C. to 50° C. under an ambient temperature of 24° C.

Since certain changes may be made in the above system and apparatus without departing from the scope of the invention herein involved, it is intended that all matter contained in the above description or shown in the accompanying drawings shall be interpreted as illustrative and not in a limiting sense.

We claim:

1. In a system of electrical circuitry wherein functional circuit boards are supported by a housing in electrical association with a backplane, said backplane having a forward face with connectors connectable with said functional circuit boards, a plurality of adjacently disposed said connectors representing fully defined bus functions, said backplane having a rearward face with a surface region within a border and disposed opposite said connectors representing fully defined bus functions, said system having a path of fan driven air and a power input location, the improvement comprising:

a plurality of power input connectors at said backplane rearward face adjacent said surface region border;

a substantially rigid power circuit board having a plurality of regulated power output terminals, each being mechanically and electrically coupled with a select one of said power input connectors and fixedly supporting said power circuit board in parallel adjacency with said rearward face at said surface region, said power circuit board having a first surface and a second surface disposed oppositely from said first surface;

at least one power converter mechanically coupled to said first surface having an input terminal for receiving a power input, having an output terminal assembly for providing a regulated d.c. output at a specified voltage level, and having an outwardly disposed heat transfer surface;

a printed circuit supported upon said power circuit board having flat leads electrically coupled between said output terminal assembly and predetermined ones of said power output terminals; and a heat-sink mounted over said power circuit board in intimate heat transfer association with said heat transfer surface.

2. The system of claim 1 in which:

said heat sink includes an array of spaced apart outwardly disposed heat exchange fins; and said housing is configured to direct at least a portion of said path of fan driven air along said fins.

3. The system of claim 1 in which:

said housing includes a supervisory portion including a reset switch actuable to derive a reset signal; and including a system control connector mounted upon said power circuit board first surface at an externally accessible location;

including a backplane connector mounted upon said power circuit board first surface at an externally accessible location;

said printed circuit includes leads electrically coupling said system control connector with said backplane connector;

said system control connector being connectable with said reset switch to convey said reset signal to said backplane connector;

including a buffer network configured with said printed circuit intermediate said system control connector and said backplane connector for buffering said reset signal;

said backplane connector being connectable with said backplane for conveying said reset signal thereto when buffered.

4. The system of claim 1 in which:

said power converter is a d.c.-to-d.c. switching power converter;

said power input location receives an a.c. power input; and including an input treatment circuit located in adjacency with said a.c. power input with an EMI filter receiving said a.c. power input and a conversion circuit for deriving said received power input as a d.c. power input for conveyance to said power converter input terminal.

5. The system of claim 4 including:

an input connector mounted upon said power circuit board at a rearwardly disposed externally accessible location; and said printed circuit includes leads electrically coupling said input connector with said power converter input terminal.

6. The system of claim 1 in which:

said housing includes a supervisory portion including an on-switch actuable to have an actuating output condition;

said power converter is a d.c.-to-d.c. switching power converter having control terminals including an enable terminal, and said power input location receives an a.c. power input;

including an input treatment circuit responsive to said a.c. power input when actuated to derive said received power input as a d.c. power input for conveyance to said power converter input terminal and having an enable signal when said d.c. power input is at a predetermined voltage level;

including an input connector mounted upon said power circuit board first surface at an externally accessible location;

including a system control connector mounted upon said power circuit board first surface at an externally accessible location;

responsive to an enable signal at said enable terminal to provide said regulated d.c. output;

including an input treatment control connector mounted upon said power circuit board first surface at an externally accessible location;

said printed circuit includes leads electrically coupling said system control connector with said input treatment control connector and said input treatment control connector with said enable terminal, said system control connector being connectable with said on-switch for receiving said actuating output condition and conveying it to said input treatment control connector; and said input treatment control connector being connectable with said input treatment circuit to convey said actuating output condition thereto to effect said actuation and for conveying said enable signal to said enable terminal.

7. The system of claim 6 in which:

said input treatment circuit includes an auxiliary power supply circuit for providing a d.c. auxiliary power supply;

said input treatment control connector being connectable with said input treatment circuit to convey said d.c. auxiliary power supply to said printed circuit; and including an enable control network configured with said printed circuit and energized by said d.c. auxiliary power supply.

8. The system of claim 1 in which:

said backplane is supported vertically within said housing, extending downwardly from an upper edge; and said connectors representing fully defined bus functions are located in a first connector row extending from said upper edge;

said backplane rearward face supports a second row of a plurality of rear connectors located below said border, said rear connectors being vertically oriented in mutually horizontally spaced apart relationship to provide interconnector spaces therebetween;

said power input connectors are located within said interconnector spaces and extend outwardly from said rearward face;

said power circuit board regulated power output terminals are supported upon finger projections extensible over said border for connection with said power input connectors.

9. The system of claim 8 in which said power circuit board and said heat sink extend from said border adjacent said regulated power output terminals to adjacency with said backplane upper edge.

10. The system of claim 8 including an inner cover coupled with said power circuit board at said second surface and with said backplane at said rearward face and configured for supporting said power circuit board in said parallel adjacency with said rearward face.

11. A backplane assembly, comprising:

a planar backplane configured for compliance with a predetermined bus standard, having a first face supporting an array of connectors for coupling with functional circuits, a plurality of adjacently disposed said connectors representing fully defined bus functions, said backplane having a second face oppositely disposed from said first face with a surface region within a border and disposed opposite said connectors representing fully defined bus functions;

a plurality of power input connectors at said backplane second face adjacent said surface region border arranged in predetermined spaced adjacency;

a power circuit board having a plurality of regulated power output terminals arranged in predetermined spaced adjacency in correspondence with said power input connectors, each being fixed to and electrically coupled with a corresponding one of said power input connectors, said power circuit board being fixedly supported over said second face at said surface region, said power circuit board having an inward surface disposed in adjacency with said second face and an outward surface disposed oppositely from said inward surface;

first and second power converters mechanically coupled to said outward surface, having respective first and second input terminals for receiving a power input, having respective first and second output terminal assemblies for providing regulated d.c. outputs at specified respective first and second voltage levels, having respective first and second outwardly disposed heat transfer surfaces, and having respective first and second control terminal assemblies;

a printed circuit supported upon said power circuit board, having leads electrically coupling said first and second output terminal assemblies with predetermined ones of said regulated output terminals; and a heat sink mounted over said power circuit board in heat transfer association with said first and second heat transfer surfaces.

12. The backplane assembly of claim 11 including:

an input connector mounted upon said power circuit board outward surface at an externally accessible location; and said printed circuit includes leads electrically coupling said input connector with said first and second input terminals.

13. The backplane assembly of claim 12 including an EMI filter network operationally coupled with said printed circuit intermediate said input connector and said first and second input terminals.

14. The backplane assembly of claim 11 in which:

said first and second control terminal assemblies include respective first and second enable terminals; and including a system control connector mounted upon said power circuit board outward surface at an externally accessible location and connectable with an on-switch at a user accessible supervisory assembly for receiving an on-signal;

including an input treatment control connector mounted upon said power circuit board outward surface at an externally accessible location and connectable with an input treatment circuit to convey said on signal thereto and for receiving an enable signal therefrom;

said printed circuit includes leads electrically coupling said system control connector with said input treatment control connector and said input treatment control connector with said first and second control terminal assemblies.

15. The backplane assembly of claim of claim 11 including:

a system control connector mounted upon said power circuit board outward surface at an externally accessible location, connectable with a reset switch actuable to derive a reset signal;

a backplane connector mounted upon said power circuit board outward surface at an externally accessible location and connectable with a reset input on said backplane for conveying a buffered reset signal thereto;

said printed circuit includes leads electrically coupling said system control connector with said backplane connector; and including a buffer network configured with said printed circuit intermediate said system control connector and said backplane connector for buffering said reset signal to derive said buffered reset signal.

16. The backplane assembly of claim 11 in which:

said regulated d.c. output of said first power converter first voltage level is greater than said second voltage level; and said first and second central terminal assemblies include respective first and second enable terminals responsive to an enable signal to derive a said regulated d.c. output;

including a system control connector mounted upon said power circuit board outward surface at an externally accessible location and connectable with an on-switch for receiving an on-signal;

including an input treatment control connector mounted upon said power circuit board outward surface at an externally accessible location and connectable with an input treatment circuit to convey said on-signal thereto from an on-switch and for receiving an enable signal and an auxiliary d.c. power input therefrom;

said printed circuit includes leads electrically coupling said first and second enable terminals with said input treatment control connector, and said input treatment control connector with said system control connector;

including first and second opto-couplers configured with said printed circuit intermediate respective said first and second enable terminals and said input treatment control connector for isolatively conveying said enable signal;

including a prioritizing network configured with said printed circuit for enabling said conveyance of said enable signal by said second opto-coupler only in the presence of said first voltage level.

17. The backplane assembly of claim 11 including an inner cover coupled with said power circuit board at said inward surface and with said backplane at said second face and configured for supporting said power circuit board in substantially parallel adjacency with said second face.

18. The backplane assembly of claim 11 in which:
said plurality of adjacently disposed connectors representing fully defined bus functions extend inwardly along said first face within a first connector row from a given edge of said backplane; and
said backplane second face supports a second row of a plurality of rear connectors located outwardly from said border, said rear connectors being arranged in mutually spaced apart relationship to provide interconnector spaces therebetween;
said power input connectors are located within said interconnector spaces and extend outwardly from said second face;
said power circuit board regulated power output terminals are supported upon finger projections extensible over said border for connection with said power input connectors.

19. The backplane assembly of claim 18 in which said power circuit board extends from said border adjacent said regulated output terminals to adjacency with said given edge.

20. A power supply assembly for providing regulated d.c. power to a backplane having an array of spaced apart upstanding power input connectors extending along the border of a fully defined region thereon, comprising:
a planar power circuit board having a plurality of spaced apart regulated power output terminals arranged in an array corresponding with said array of power input connectors for rigid connection therewith, said power circuit board having oppositely disposed first and second surfaces;
first and second power converters mechanically coupled to said power circuit board first surface, having respective first and second input terminals for receiving a power input, having respective first and second output terminal assemblies for providing regulated d.c. outputs at specified respective first and second voltage levels, having respective first and second outwardly disposed heat transfer surfaces, and having respective first and second control terminal assemblies;
an input connector mounted upon said power circuit board first surface at an externally accessible location;
a printed circuit supported upon said power circuit board, having flat leads electrically coupling said first and second output terminal assemblies with predetermined ones of said regulated output terminals, and electrically coupling said first and second input terminals with said input connector; and
a heat sink mounted over said power circuit board first surface in heat transfer association with said first and second heat transfer surfaces.

21. The power supply assembly of claim 20 including an inner cover coupled with said power circuit board at said second surface and spaced therefrom a distance corresponding with the configuration of said upstanding power input connectors.

22. The power supply assembly of claim 20 including an EMI filter network operationally coupled with said printed circuit intermediate said input connector and said first and second input terminals.

23. The power supply assembly of claim 20 in which:
said first and second control terminal assemblies include respective first and second enable terminals; and
including a system control connector mounted upon said power circuit board first surface at an externally accessible location and connectable with an on-switch at a user accessible supervisory assembly for receiving an on-signal;
including an input treatment control connector mounted upon said power circuit board first surface at an externally accessible location and connectable with an input treatment circuit to convey said on signal thereto and for receiving an enable signal therefrom;
said printed circuit includes leads electrically coupling said system control connector with said input treatment control connector and said input treatment control connector with said first and second control terminal assemblies.

24. The power supply assembly of claim 20 in which:
said regulated d.c. output of said first power converter first voltage level is greater than said second voltage level; and
said first and second control terminal assemblies include respective first and second enable terminals responsive to an enable signal to derive a said regulated d.c. output;
including a system control connector mounted upon said power circuit board first surface at an externally accessible location and connectable with an on-switch for receiving an on-signal;
including an input treatment control connector mounted upon said power circuit board first surface at an externally accessible location and connectable with an input treatment circuit to convey said on-signal thereto from an on-switch and for receiving an enable signal and an auxiliary d.c. power input therefrom;
said printed circuit includes leads electrically coupling said first and second enable terminals with said input treatment control connector, and said input treatment control connector with said system control connector;
including first and second opto-couplers configured with said printed circuit intermediate respective said first and second enable terminals and said input treatment control connector for isolatively conveying said enable signal;
including a prioritizing network configured with said printed circuit for enabling said conveyance of said enable signal by said second opto-coupler only in the presence of said first voltage level.

25. The power supply assembly of claim 20 including:
a system control connector mounted upon said power circuit board first surface at an externally accessible location connectable with a reset switch actuable to derive a rest signal;
a backplane connector mounted upon said power circuit board first at an externally accessible location and connectable with a reset input at a said backplane for conveying a buffered reset signal thereto;
said printed circuit includes leads electrically coupling said system control connector with said backplane connector; and
including a buffer network configured with said printed circuit intermediate said system control connector and said backplane connector for buffering said reset signal to derive said buffered reset signal.

\* \* \* \* \*